United States Patent
Hashimoto et al.

(10) Patent No.: US 7,210,969 B1
(45) Date of Patent: May 1, 2007

(54) PRESS-FIT FIXING TERMINAL, AND ELECTRONIC COMPONENT HAVING THE SAME TERMINAL

(75) Inventors: Yukio Hashimoto, Okayama (JP); Seiki Miura, Okayama (JP); Takumi Nishimoto, Okayama (JP); Takashi Tomago, Okayama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/511,445

(22) Filed: Aug. 29, 2006

(30) Foreign Application Priority Data

Nov. 10, 2005 (JP) .............................. 2005-325681

(51) Int. Cl.
*H01R 13/42* (2006.01)
(52) U.S. Cl. ....................................... 439/751; 439/82
(58) Field of Classification Search ................. 439/82, 439/84, 742, 751, 870, 872, 884
See application file for complete search history.

(56) References Cited

U.S. PATENT DOCUMENTS 3,846,741 A * 11/1974 Kunkle et al. ................ 439/82
4,505,529 A * 3/1985 Barkus ......................... 439/82
5,556,308 A * 9/1996 Brown et al. ................ 439/746
6,524,129 B2 * 2/2003 Cote et al. ................... 439/511
7,044,807 B2 * 5/2006 Furuno et al. ............... 439/751

FOREIGN PATENT DOCUMENTS

JP  2003-257526  9/2003

* cited by examiner

*Primary Examiner*—Hien Vu
(74) *Attorney, Agent, or Firm*—Wenderoth, Lind & Ponack, L.L.P.

(57) ABSTRACT

A press-fit fixing terminal is mountable to a wiring board by being inserted into a through-hole of the wiring board, and includes a flat plate section and a resilient contacting section. The flat plate section is made of metal thin plate and double-backed such that an end of the flat plate section is placed on a root side and a bent point works as an insertion tip when the terminal is inserted into the through-hole. The resilient contacting sections sandwich the double-backed portion of the flat plate section such that they are placed symmetrically with respect to the double-backed portion and both of the ridges of the resilient contacting section face outward viewed from the double-backed portion, so that each one of the resilient contacting sections forms a V-shape including an obtuse angle.

8 Claims, 6 Drawing Sheets

_US 7,210,969 B1_

PRESS-FIT FIXING TERMINAL, AND ELECTRONIC COMPONENT HAVING THE SAME TERMINAL

FIELD OF THE INVENTION

The present invention relates to a press-fit fixing terminal to be inserted into a through-hole of a wiring board in order to mount various electronic components to the wiring board, and the press-fit fixing terminal connects the component mechanically and electrically to the wiring board. The present invention also relates to electronic components having the same terminals.

BACKGROUND OF THE INVENTION

Methods of mounting electronic components onto a wiring board have focused on streamlining the mounting jobs, and also on alleviating the environmental load as a lead-free soldering. Under such a climate, a press-fit fixing terminal is employed to some mounting methods instead of soldering.

This conventional press-fit fixing terminal is described with reference to FIG. 6–FIG. 8. FIG. 6 shows a front view of the conventional terminal, and FIG. 7 shows a lateral view of the terminal shown in FIG. 6. FIG. 8 shows a schematic sectional view cut along line 8—8 of FIG. 6, namely, a schematic sectional view illustrating the press-fit fixing terminal mounted to a wiring board. In FIG. 6, press-fit fixing terminal 301 is attached to electronic component 302, and terminal 301 is formed symmetrically with respect to a center axis of an inserting direction to the wiring board.

Press-fit fixing terminal 301 has hollow section 303 formed by blanking along the outline thereof. Terminal 301 is formed of two lines, and each one of the lines includes extending section 304 linearly extends from the root of electronic component 302, straddling section 305 which flares gradually from extending section 304 to ridges 306, and terminal segments 307 which tapers off from ridges 306 to tip of terminal 301.

As shown in FIG. 7, the one line formed of straddling section 305 and terminal segment 307 is bent, thereby forming a V-shaped wedge, the other line formed of straddling section 305 and terminal segment 307 is bent in the same way, so that the two lines are spaced out widest at ridges 306.

Press-fit fixing terminal 301 discussed above is press-fitted into through-hole 308 provided to wiring board 309 as shown in FIG. 8. The inner diameter of through-hole 308 is slightly smaller than the maximum width between two ridges 306 in order to maintain the mechanical and electrical connections of terminal 301.

Prior art related to the present invention is disclosed in, e.g. Unexamined Japanese Patent Publication No. 2003-257526.

As shown in FIG. 8, conventional press-fit fixing terminal 301 has two ridges 306 which are brought into contact with through-hole 308 at the insertion, and ridges 306 are the cut-faces or the corners produced by blanking press-fit terminal 301 out of the material metal plate, so that the ground of the material contacts through-hole 308. In order to get stable electrical contact, terminal 301 undergoes a plating process after the blanking. The plating process incurs an additional cost and sometimes invites deformation.

SUMMARY OF THE INVENTION

The press-fit fixing terminal of the present invention is mountable to a wiring board by being inserted into a through-hole of the wiring board, the terminal comprises the following elements:

a flat plate section made of metal thin plate and double-backed such that its end is placed on a root side and a bent point works as an insertion tip when the terminal is inserted into the through-hole; and two resilient contacting sections sandwiching a double-backed portion of the flat plate section and placed symmetrically with respect to the double-backed portion, and respective ridges of the resilient contacting sections facing outward viewed from the double-backed portion, i.e. each one of the resilient contacting sections forming a V-shape including an obtuse angle.

The resilient contacting section of the terminal is formed this way: a center part of the flat plate section is cut out to form a long and narrow shape, and a first end of the long and narrow shape remains solid with the flat plate section, and a second end thereof is left free. In other words, the flat plate section is cut at its center part along the longitudinal direction such that the center part is hold between narrow parts on both sides. The narrow parts are namely borders of the flat plate section in the width direction.

Electronic components of the present invention are equipped with press-fit fixing terminals mountable to a wiring board by being inserted into through-holes. The terminals have the structure discussed above.

This construction allows the press-fit fixing terminal to be made of thin material in thickness, so that the terminal can be resistant to plastic deformation and stable in contact. On top of that, the surface of original material not have been cut can be used as a contacting face, so that electrical contact becomes stable. The material undergone a plating process can be used, so that an inexpensive press-fit fixing terminal excellent in contact stability is achievable, and an electronic component equipped with this press-fit fixing terminal is obtainable.

DETAILED DESCRIPTION OF PREFERRED EMBODIMENT

Figure 1:
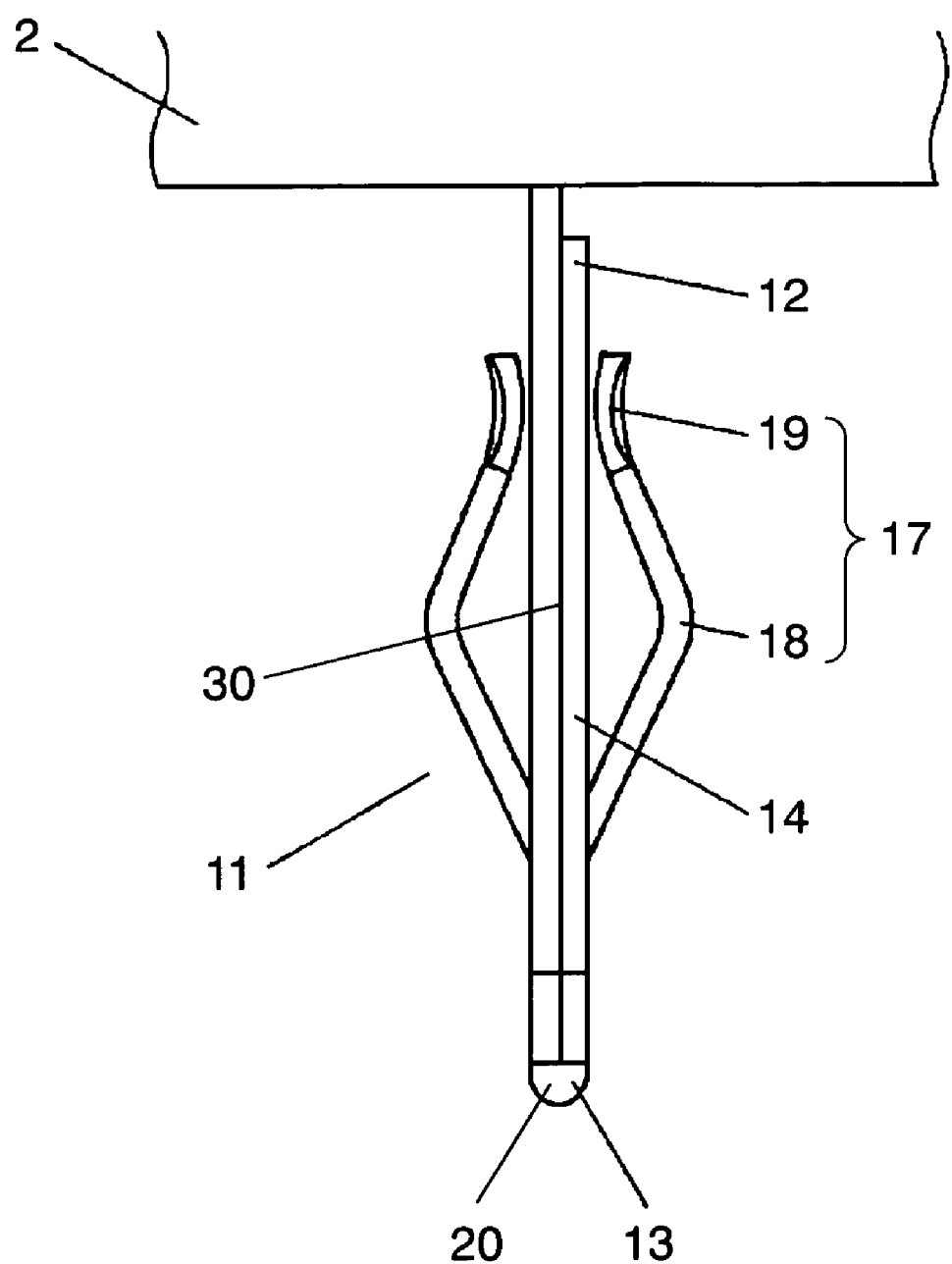
FIG. 1 shows a front view of a press-fit fixing terminal in accordance with an embodiment of the present invention.
Figure 2:
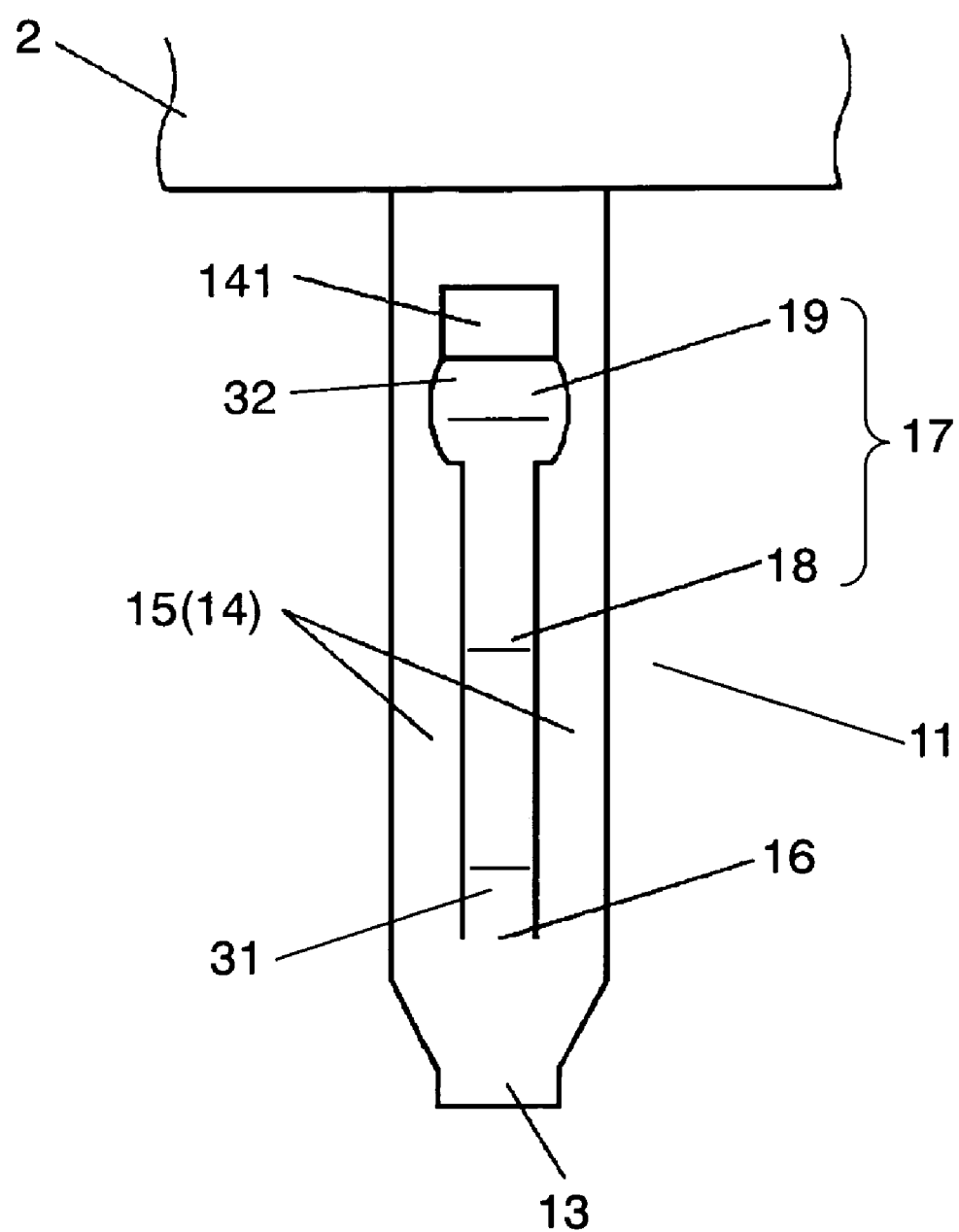
FIG. 2 shows a lateral view of the press-fit fixing terminal shown in FIG. 1.
Figure 3:
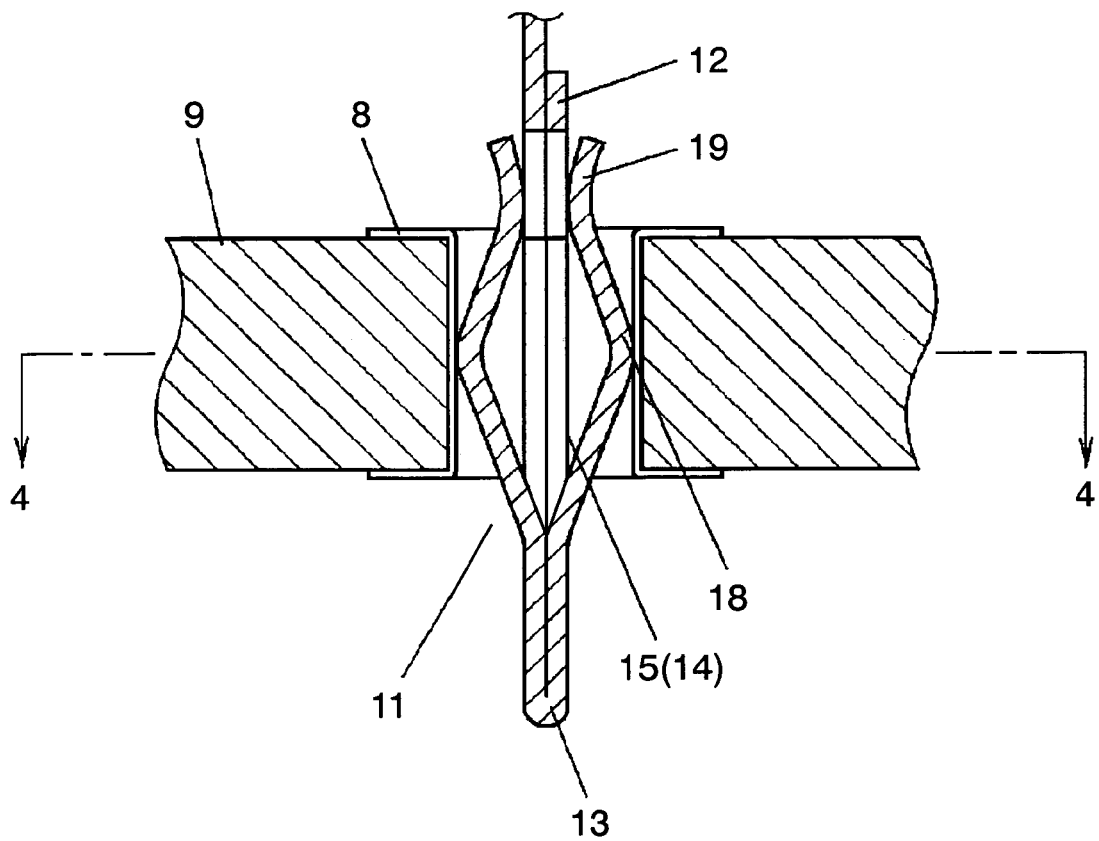
FIG. 3 shows vertical sectional view illustrating the press-fit fixing terminal, shown in FIG. 1, being press-fitted into a through-hole of a wiring board.
Figure 4:
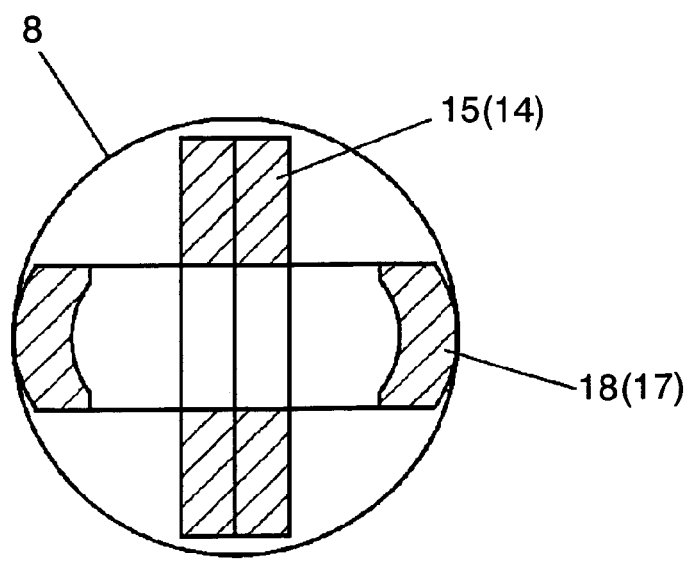
FIG. 4 shows a horizontal sectional view taken along line 4—4 of FIG. 3.
Figure 5:
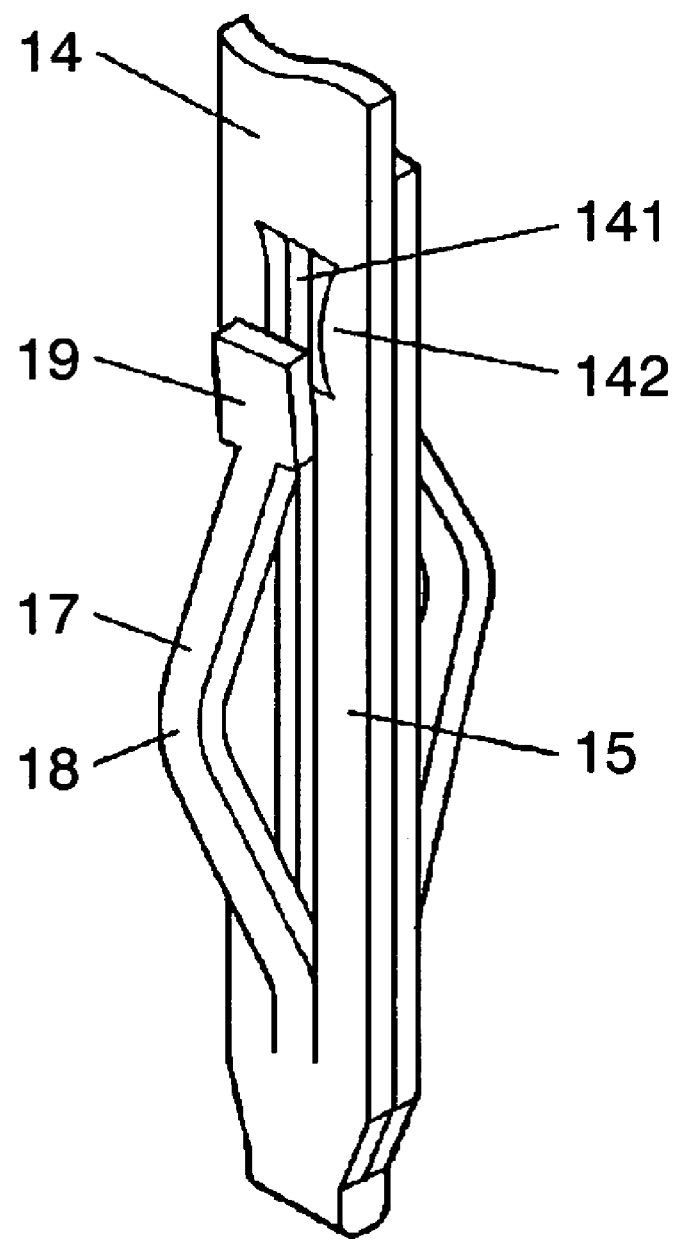
FIG. 5 shows an external appearance of another press-fit fixing terminal having a different structure.
Figure 6:
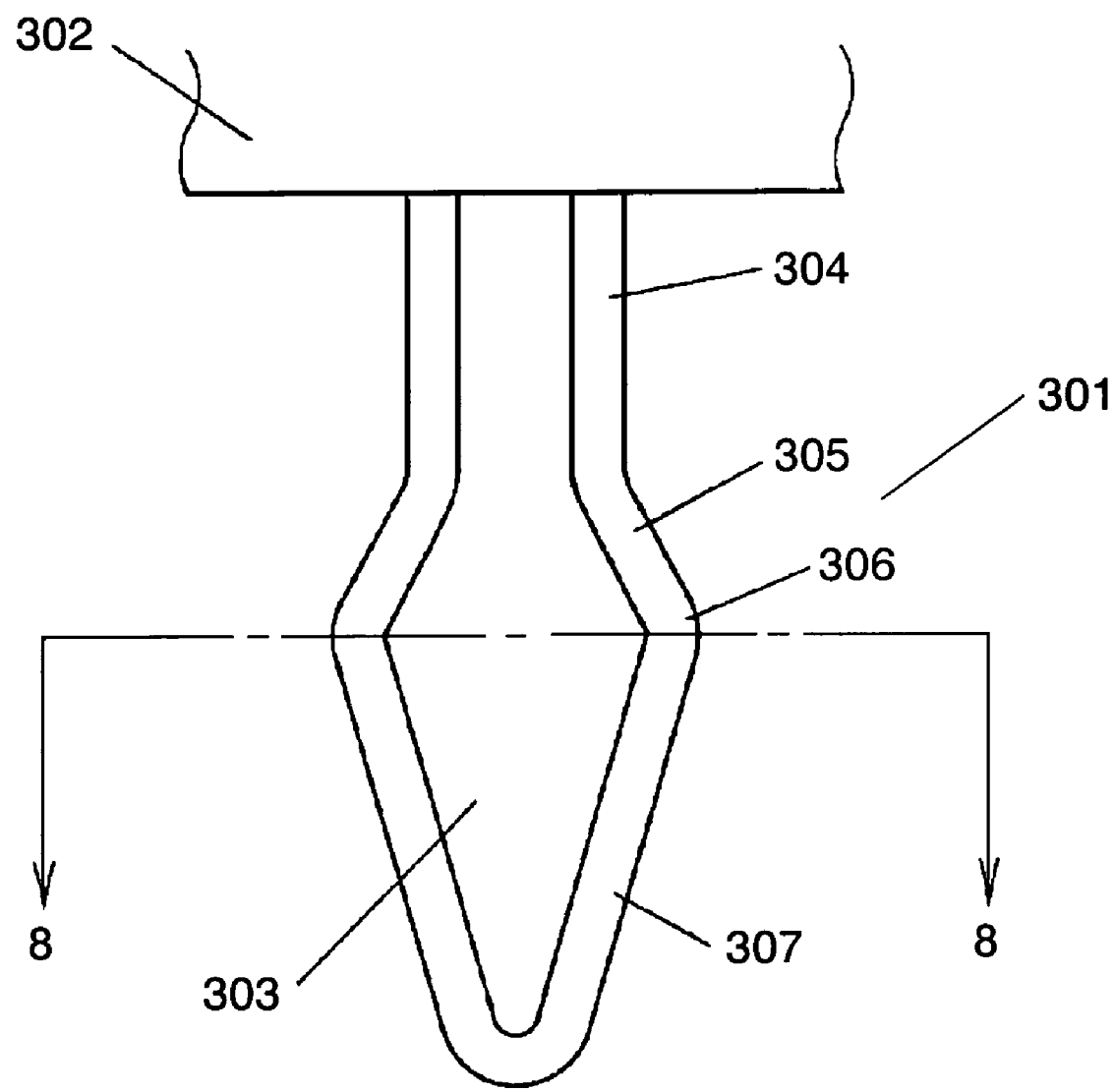
FIG. 6 shows a front view of a conventional press-fit fixing terminal.
Figure 7:
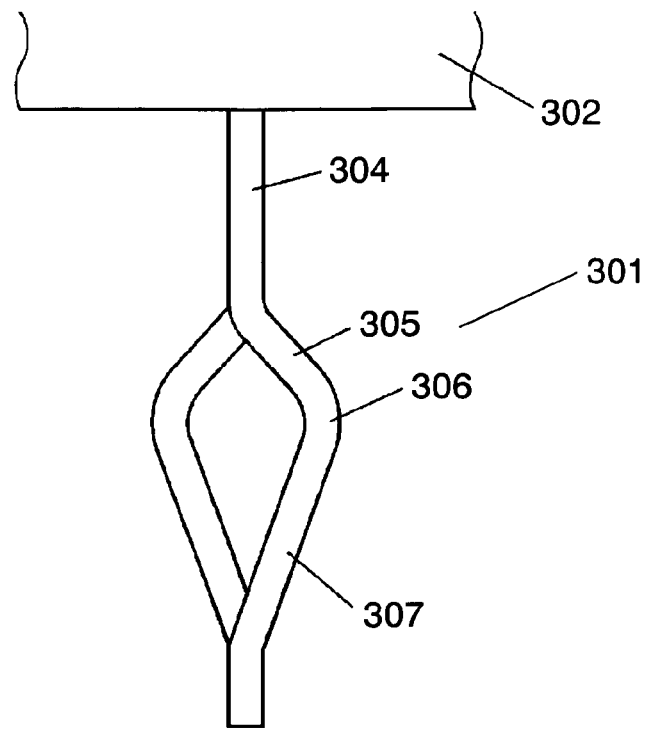
FIG. 7 shows a lateral view of the press-fit fixing terminal shown in FIG. 6.
Figure 8:
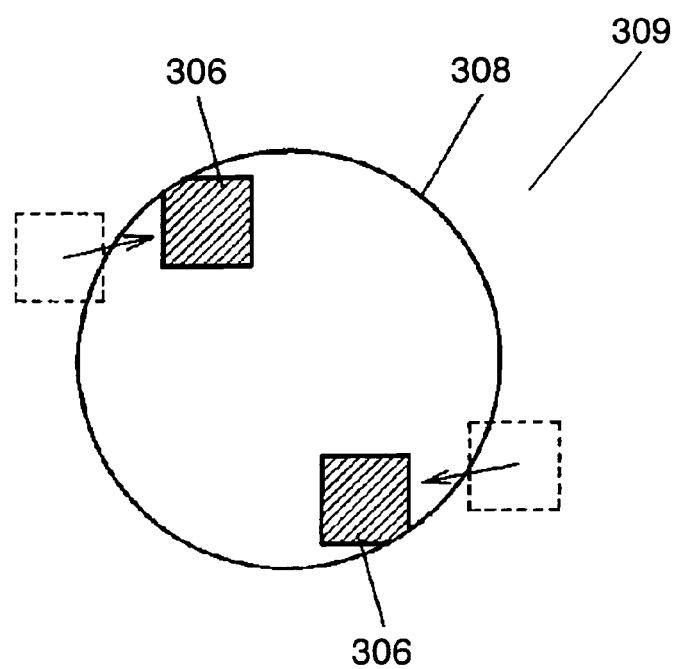
FIG. 8 shows a schematic sectional view taken along line 8—8 of FIG. 6 and illustrating the press-fit fixing terminal, shown in FIG. 6, being mounted to a wiring board.

An exemplary embodiment of the present invention is demonstrated hereinafter with reference to the accompanying drawings. FIG. 1 shows a front view of a press-fit fixing terminal in accordance with the embodiment of the present invention. FIG. 2 shows a lateral view of the press-fit fixing terminal shown in FIG. 1. FIG. 3 shows vertical sectional view illustrating the press-fit fixing terminal, shown in FIG. 1, being press-fitted into a through-hole of a wiring board. FIG. 4 shows a horizontal sectional view taken along line 4—4 of FIG. 3.

In FIG. 1 and FIG. 2, press-fit fixing terminal 11 of the present invention is mountable to a wiring board by being press-fitted into a through-hole of the wiring board, and terminal 11 includes flat plate section 14 and resilient contacting section 17.

Flat plate section 14 is made of metal thin plate and double-backed, so that end 12 is placed near the root, and bent point 20 works as insertion tip 13 when terminal 11 is press-fitted into a through hole. Two resilient contacting sections 17 sandwich double-backed section 30 of flat plate section 14, and are placed symmetrically with respect to double-backed section 30. Both ridges 18 face outward viewed from double-backed section 30, so that each one of the resilient contacting sections 17 forms a V-shape including an obtuse angle.

Resilient contacting section 17 is formed this way: a center part of flat plate section 14 is cut out to form a long and narrow shape, and first end 31 of the long and narrow shape remains solid with flat plate section 14 and second end 32 of the long and narrow shape is left free. In other words, flat plate section 14 is cut at its center part along the longitudinal direction such that the hole left after the cut is held between narrow parts 15 on both sides. Narrow parts 15 are namely borders of flat plate section 14 in the width direction.

Press-fit fixing terminal 11 in accordance with this embodiment is further detailed hereinafter with reference to FIG. 1–FIG. 4. In FIGS. 1 and 2, terminal 11 is integrated into electronic component 2, and made of resilient metal thin plate including copper alloy having undergone a well electrically conductive plating process. The metal thin plate is double-backed such that end 12 of flat plate section 14 led out from electronic component 2 is placed near the root extending from component 2. The metal thin plate is thus double-backed, so that double-backed section 30 is formed. The bent point i.e. turn 20 works as insertion tip 13 when the terminal is inserted into a through hole of a wiring board.

Press-fit fixing terminal 11 is cut at its center part along the longitudinal direction such that the center part forms a long and narrow shape, narrow parts 15 on both sides of the center part remain solid with flat plate section 14, and the center section remains solid with (connecting to) flat plate section 14 only at its lower end, i.e. on the side of insertion tip 13.

This long and narrow shape is processed into resilient contacting section 17 forming a V-shape including an obtuse angle this way: the shape is provided to both the faces of double-backed section 30 such that the shape becomes symmetrically on both sides, and both ridges 18 face outward viewed from double-backed section 30, so that the long and narrow portion forms a V-shape including an obtuse angle.

In other words, resilient contacting section 17 is cut out at its center section held between narrow parts 15 on both sides, which are borders of flat plate section 14 in the width direction, and first end 31 of the long and narrow portion remains solid with (connecting to) flat plate section 14, and second end 32 is left free.

Two resilient contacting sections 17 are punched out like "shearing off" free from tailings when they are punched out from flat plate section 14. The free end on the opposite side of connecting section 16, namely, second end 32 of resilient contacting section 17 forms wider section 19 having a greater width along the width direction than first end 31. Wider section 19, i.e. second end 32 can be bent away from flat plate section 14 in a regular status without any load.

Wider section 19, i.e. second end 32 is rolled to become much wider, so that second end 32 has a greater width than that of slit hole 141 left behind punching out resilient contacting section 17 from flat plate section 14. Ridges 18 of two resilient contacting sections 17 protrude outward at their centers, so that a roughly spherical shape is formed on respective sides in the sectional view cut along the width direction.

Press-fit fixing terminal 11 discussed above is press-fitted into a through hole of a wiring board. This status is described hereinafter with reference to FIGS. 3 and 4, in which terminal 11 is press-fitted in through-hole 8 provided to wiring board 9.

Two resilient contacting sections 17 are bent such that the space between two ridges 18 of two V-shaped resilient contacting sections 17 becomes somewhat greater than the diameter of through-hole 8. This structure allows each one of the free end, i.e. wider section 19 formed on the upper end of contacting section 17, to resiliently slide upward on the surface of flat plate section 14, and when the space between two ridges 18 becomes narrow enough due to the slide for two ridges 18 to fit into through-hole 8, resilient contacting sections 17 are press-fitted into through-hole 8 and urge against the inner wall of through-hole 8.

Since resilient contacting section 17 is bent into a V-shape including an obtuse angle, its free end, i.e. wider section 19, is brought into contact with slit hole 141 having a narrower width than that of a hole left behind punching out wider section 19 from flat plate section 14. Wider sections 19 thus will not fall into slit hole 141 in the regular status or when resilient contacting section 17 is press-fitted. Yet, in this embodiment, wider section 19 is rolled to be much wider, so that wider section 19 is positively prevented from falling into slit hole 141. As a result, the press-fit into through-hole 8 can be done smoothly.

The free end, namely, wider section 19, is bent away from flat plate section 14 in regular status. The cut edge of the free end thus becomes farther away from the surface of flat plate section 14. The bent point of wider section 19 slides smoothly on the surface of flat plate section 14 with a little contact resistance, so that terminal 11 can be inserted with ease and a stable contacting pressure can be expected.

As shown in FIG. 4, ridges 18 form roughly spherical surfaces of which center parts moderately protrude outward, so that the contacting portions to the inner wall of through-hole 8 become close to area contact. The previous discussion proves that the cut edge of terminal 11 is not used as the contacting portion, so that terminal 11 provides stable electrical contact.

This embodiment proves that the material face prior to the process can be used as contacting face of resilient contacting section 17, so that the contacting face resiliently contacts through-hole 8. Therefore, well-conductive material such as silver can be used as plated material, so that inexpensive press-fit fixing terminals are obtainable.

Two resilient contacting sections 17 confronting each other allow terminal 11 to secure sufficient contacting pressure although the material is metal thin plate, so that stable mechanical connection is obtainable. On top of that, since plated material can be used, an electrical contacting function can be integrated into the inside (not shown) of electronic component 2.

Resilient contacting section 17 which works as a mechanical connector as well as an electrical connector to through-hole 8 is formed by cutting out (shearing off) the center portion in width direction of flat plate section 14 of terminal 11, so that terminal 11 needs only a narrow width and scrapped material can be thus minimized.

In this embodiment, the free end of resilient contacting section 17, namely, wider section 19, is rolled to be wider than the width of slit hole 141, however, narrow parts 15 of flat plate section 14 can be crushed to form projection 142 for narrowing the width of slit hole 141. This structure prevents wider section 19 from falling into slit hole 141, and allows ridges 18 to contact through-hole 8 mechanically and electrically in stable manner. Although this is not illustrated, narrow parts 15 can be pushed inside laterally along the width direction to deform for narrowing the width of slit hole 141. This preparation also produces an advantage similar to what is discussed previously.

Wider section 19 is not always needed, because the width of the resilient contacting section can be flared from the border between the flat plate section and the resilient contacting section toward the free end. This structure can also prevent the resilient contacting section from falling into the slit hole.

The press-fit fixing terminal of the present invention is useful product because it can be used in variable resistors, encoders, switches, and antennas.

According to the present invention, an original face of flat plate of the material can be used as a contacting face, so that the material having undergone plating process can be used, which allows providing inexpensive press-fit fixing terminals having stable contact with through-holes.

In the case of using the resilient contacting section punched out (sheared off) from the flat plate section, a press-fit fixing terminal having a narrow width is obtainable, so that scrapped material can be minimized and a through-hole having a smaller diameter can receive the terminal. As a result, electronic devices using this terminal can be downsized.

The resilient contacting section, forming a V-shape with an obtuse angle inclusive and having a second end wider than a first end, can prevent the free end (second end) from falling into the slit hole of the flat plate section, so that stable contacting pressure is obtainable.

The resilient contacting section, of which free end (second end) is bent away from the flat plate section, allows the free end to confront the flat plate section when the terminal is inserted into a through-hole, so that contact resistance is reduced and the resilient contacting section tends to be resiliently deformed. As a result, the terminal is easy to press-fitted, and a stable contact pressure can be expected.

The resilient contacting section having the second end (free end) wider than the width of the slit hole formed by punching out the resilient contacting section from the flat plate section prevents the free end from falling into the slit hole, so that stable contact pressure is obtainable.

The resilient contacting section having a ridge, of which center protrudes outward and forms roughly a spherical surface in a sectional view cut along the width direction, allows contacting the through-hole with generally a spherical face, so that stable contact is obtainable.

Press-fit fixing terminals of the present invention can employ plated material, so that stable contact and an inexpensive cost can be advantageously expected. The terminals thus can be employed as terminals of electronic components which are to be mounted to wiring boards by press-fitting the terminals into the through-holes.

What is claimed is:

1. A press-fit fixing terminal mountable to a wiring board by being inserted into a through-hole of the wiring board, the press-fit fixing terminal comprising:
   a flat plate section made of metal thin plate and constituting a double-backed section such that an end of the plate is placed on a root side and a bent point works as an insertion tip when the terminal is inserted into the through-hole; and
   resilient contacting sections each forming a V-shape including an obtuse angle and sandwiching the flat plate section such that the resilient contacting sections are placed symmetrically with respect to the flat plate section and ridges of the resilient contacting sections face outward respectively viewed from the flat plate section;
   wherein the resilient contacting sections are each cut out at a center portion along a longitudinal direction to form a long and narrow shape held between narrow portions on both sides which are borders of the flat plate section in a width direction, and a first end of the long and narrow shape connects to the flat plate section, and a second end of the long and narrow shape forms a free end.

2. The press-fit fixing terminal of claim 1, wherein the resilient contacting section is formed by being sheared off from the flat plate section for avoiding tailings which are produced at punching the flat plate section.

3. The press-fit fixing terminal of claim 1, wherein the resilient contacting section has the second end wider than the first end.

4. The press-fit fixing terminal of claim 1, wherein the resilient contacting section has the second end which is bent away from the flat plate section.

5. The press-fit fixing terminal of claim 1, wherein the second end of the resilient contacting section has a greater width than a width of a slit hole formed by punching out the resilient contacting section from the flat plate section.

6. The press-fit fixing terminal of claim 1, wherein a center of the ridge forms a spherical surface protruding outward in a sectional view cut along a width direction.

7. The press-fit fixing terminal of claim 1 being integrated with an electronic component.

8. An electronic component including a press-fit fixing terminal which is mountable to a wiring board by being inserted into a through-hole of the wiring board, the press-fit fixing terminal comprising:
   a flat plate section made of metal thin plate and constituting a double-backed section such that an end of the plate is placed on a root side and a bent point works as an insertion tip when the terminal is inserted into the through-hole; and
   resilient contacting sections forming a V-shape including an obtuse angle and sandwiching the flat plate section such that the resilient contacting sections are placed symmetrically with respect to the flat plate section and ridges of the resilient contacting sections face outward respectively viewed from the flat plate section;
   wherein the resilient contacting sections are each cut out at a center portion along a longitudinal direction to form a long and narrow shape held between narrow portions on both sides which are borders of the flat plate section in a width direction, and a first end of the long and narrow shape connects to the flat plate section, and a second end of the long and narrow shape forms a free end.

* * * * *